US010170680B2

(12) United States Patent
Abraham et al.

(10) Patent No.: US 10,170,680 B2
(45) Date of Patent: Jan. 1, 2019

(54) QUBITS BY SELECTIVE LASER-MODULATED DEPOSITION

(71) Applicant: INTERNATIONAL BUSINESS MACHINES CORPORATION, Armonk, NY (US)

(72) Inventors: David W. Abraham, Croton, NY (US); Jay M. Gambetta, Yorktown Heights, NY (US); Mary B. Rothwell, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 772 days.

(21) Appl. No.: 14/856,274

(22) Filed: Sep. 16, 2015

(65) Prior Publication Data

US 2017/0072504 A1    Mar. 16, 2017

(51) Int. Cl.
*B23K 26/00* (2014.01)
*B23K 26/34* (2014.01)
*B23K 26/38* (2014.01)
*H01L 39/24* (2006.01)
*G06N 99/00* (2010.01)
*H01L 29/76* (2006.01)

(52) U.S. Cl.
CPC .......... *H01L 39/24* (2013.01); *G06N 99/002* (2013.01); *H01L 29/7613* (2013.01)

(58) Field of Classification Search
CPC ........ B23K 26/00; B23K 26/34; B23K 26/38; H01L 39/24; H01L 39/2467; H01L 39/249

USPC .................... 219/121.69; 438/2, 962; 257/31
See application file for complete search history.

(56) References Cited

U.S. PATENT DOCUMENTS

| | | | |
|---|---|---|---|
| 4,349,583 A | 9/1982 | Kulynych et al. | |
| 4,681,774 A | 7/1987 | Halliwell et al. | |
| 6,504,172 B2 | 1/2003 | Zagoskin et al. | |
| 8,220,988 B2* | 7/2012 | Werner | G01N 27/121 29/846 |
| 8,872,360 B2 | 10/2014 | Chow et al. | |
| 8,928,391 B2 | 1/2015 | Naaman et al. | |
| 8,975,912 B2 | 3/2015 | Chow et al. | |
| 9,018,562 B2* | 4/2015 | Dantus | B23K 26/032 219/121.76 |
| 2003/0183884 A1* | 10/2003 | Miyazawa | H01L 23/5223 257/401 |

OTHER PUBLICATIONS

Arnold, C.B. et al., "Laser Direct-Write Processing," MRS Bulletin, vol. 32, Jan. 2007. (pp. 9-15).
Chen, Q.J. et al., "Laser Direct Writing of Aluminum Conductor Lines from a Liquid Phase Precursor," MRS Proceedings, vol. 397, Nov. 1995. (pp. 1-6).

(Continued)

*Primary Examiner* — Samuel M Heinrich
(74) *Attorney, Agent, or Firm* — Tutunjian & Bitetto, P.C.; Rabin Bhattacharya

(57) ABSTRACT

A method for adjusting a qubit includes measuring a qubit characteristic of a qubit device and computing a modification to correct the qubit characteristic. A geometry of a shunt capacitor is adjusted using a laser direct write process. The qubit characteristic is verified.

20 Claims, 2 Drawing Sheets

(56) References Cited

OTHER PUBLICATIONS

Metkus, K. M. et al., "Laser Direct-Write for Low AC Loss High Temperature Superconductor Applications," JLMN—Journal of Laser Micro/Nanoengineering vol. 8, No. 1, Feb. 2013. (pp. 1-5).
Sandberg, M. et al., "Etch induced microwave losses in titanium nitride superconducting resonators," Applied Physics Letters, vol. 100, Jun. 2012. (pp. 1-5).
Treiger, L.M., et al., "Laser direct writing of aluminum multilevel interconnects for VLSI applications," Microelectronic Engineering, vol. 19, Sep. 1992. (pp. 1-4).

* cited by examiner

QUBITS BY SELECTIVE LASER-MODULATED DEPOSITION

BACKGROUND

Technical Field

The present invention relates to superconductor qubits, and more particularly to devices and methods for tuning qubit frequencies using a laser technology.

Description of the Related Art

Superconducting quantum bits (qubits) show great promise for quantum computing, with ever-increasing coherence times combined with the possibility of standard semiconductor fabrication methods leading to visions of a useful quantum computer. However, one outstanding problem is in the control of qubit frequencies. For example, operation in a surface code implementation requires control of fabricated qubit frequencies to permit gate operation on a lattice. A minimum of at least five distinct frequencies is required. In addition, to reduce drive electronics complexity, it is desirable to control frequency distributions of nominally identical qubits to within a known tolerance.

The observed spread in Josephson junction critical currents is in the range of 10% standard deviation depending on junction size, corresponding to ~5% spread in qubit frequency. Despite decades of research into fabrication and control of Josephson junctions, no significant improvement has been seen in the spread observed. Similar spreads are observed in other oxide junction technologies such as magnetic memory (MRAM), indicating that this may be an intrinsic property of such devices.

Qubit frequencies need to be controlled, and the fabrication process typically used for devices results in a spread of frequencies which is insufficient for application in a large scale quantum computer.

SUMMARY

A method for adjusting a qubit includes measuring a qubit characteristic of a qubit device and computing a modification to correct the qubit characteristic. A geometry of a shunt capacitor is adjusted using a laser direct write process. The qubit characteristic is verified.

Another method for adjusting a qubit includes fabricating a qubit device, wherein the qubit device includes a Josephson junction; measuring a qubit characteristic of a qubit device; computing a modification to correct the qubit characteristic to achieve a needed performance for the qubit device; adjusting a geometry of a shunt capacitor, post production, using a laser direct write process; verifying that the qubit characteristic has been changed by the adjusting of the geometry; and repeating until the qubit characteristic has been corrected.

A qubit device includes a Josephson junction and a shunt capacitor coupled to the Josephson junction, the shunt capacitor including a shape modified, post-production, to adjust a qubit characteristic for the qubit device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
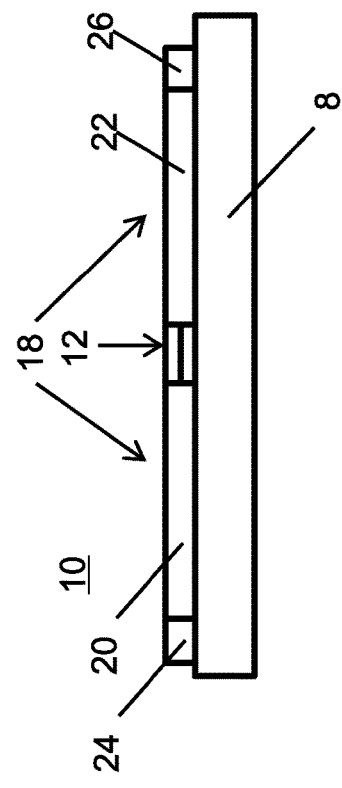
FIG. 1 is a side view of a qubit device showing a shunt capacitor after production in accordance with the present principles.

In accordance with the present principles, methods and systems are provided that adjust each qubit frequency to eliminate undesirable spreads of frequencies. In one embodiment, accurate adjustment of the qubit is provided to ensure a qubit frequency remains with an acceptable tolerance for one of the distinct frequency values needed for quantum computing. It is therefore of interest to control the qubit frequencies. Given that oxide junctions used to provide inductance seem to have an intrinsic and significant spread in critical currents, one avenue for control frequency spreads is to compensate by subtle changes in shunt capacitance. In one useful embodiment, adjustment is made to an area of a shunting capacitor on the qubit by laser-mediated processes. In particular laser direct write processes including laser direct write addition, laser direct write subtraction and laser direct write modification may be employed. Laser direct write addition may include electrodeposition of material. Laser direct write subtraction may include ablation of laser drilling. Laser direct write modification may include oxidizing material using a laser.

In accordance with one method, qubits are measured and the capacitor adjusted by direct laser write methods. This assumes that the qubit frequency is stable against time and temperature cycling. The method of adjusting qubit frequency includes measuring a qubit, computing a correction, shaping the shunt capacitor, verifying the frequency, and repeating, if necessary. In one embodiment, the adjusting is performed using a laser writing technique, such as laser direct write. Laser direct write includes employing a laser to direct deposition of a material. In one example, an argon laser is employed to deposit aluminum methylamine hydride or other superconductive material, e.g., Al, W, Pb, Nb, etc. The correction pattern is preferably placed in a position of minimum electric field participation so that reduction of qubit coherence is minimized.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. The chips are packaged in a manner consistent with the cryogenic environment needed by the qubits and then would be assembled into a larger system forming a quantum computer or other device employing the properties of the qubit structures.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a schematic diagram shows a superconducting qubit 10. The qubit 10 is formed on a substrate 8 and includes a shunt capacitor 18 coupled to superconducting electrodes 20, 22 of a Josephson junction 12. The shunt capacitor 18 in this embodiment includes a planar capacitor having pads 20, 22. The superconducting qubit 10 has a characteristic frequency determined by a capacitance between one or more of the pads 20, 22 and an inductance of the Josephson junction 12. The plates 20, 22 are coplanar, so that the capacitance between the plates 20, 22 is determined by fringing fields between the two plates.

Supercurrent ($I_s$) through a Josephson junction (JJ) is given by $I_s = I_c \sin(\varphi)$, where $\varphi$ is the phase difference of superconducting wave functions of the two electrodes 20, 22, i.e. the Josephson phase. Critical current ($I_c$) is the maximum supercurrent that can flow through the Josephson junction 10. This critical current gives rise to a non-linear inductance L given by $$L = \frac{\Phi_0}{2\pi I_c}$$

where $\Phi_0$ is the flux quantum. The qubit is a microwave oscillator with a characteristic frequency for the 0-1 transition given by $\omega = \omega = 1/\sqrt{LC}$, where L is the inductance of the Josephson junction 12 and C is the shunt capacitance defined by plates 20 and 22.

In accordance with the present principles, to adjust each qubit frequency to eliminate undesirable spreads of frequencies, adjustment of the qubit is provided to ensure a qubit frequency remains with an acceptable tolerance for one of the (5 or more) distinct frequency values needed for quantum computing. To control the qubit frequencies, changes in shunt capacitor 18 may be provided.

Qubit capacitance may be adjusted using a relationship such as qubit frequency $\rightarrow \omega + \omega \Delta C / 2C$. So to change the frequency by 5%, the capacitance is changed by 10% which, in one example, can amount to about 6 fF. The impact of such a difference in capacitance (6 fF) on the qubit frequency only results in a 30 MHz change in the anharmonicity. This will not limit the qubit performance and will tune qubit frequency with only minor effects on the qubit anharmonicity.

Figure 2:
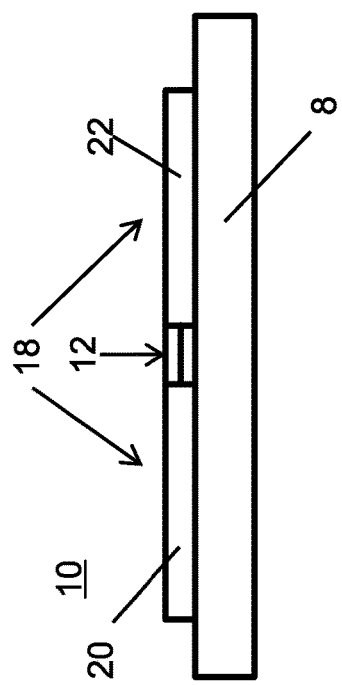
FIG. 2 is a side view of the qubit device of FIG. 1 showing material added to the shunt capacitor using a laser direct write process in accordance with the present principles.

Referring to FIG. 2, a laser-mediated electrodeposition process is employed to write material on or in contact with the shunt capacitor 18. The shunt capacitor 18 may be enhanced by adding material 24, 26 to the plates 20, 22 to adjust the capacitance. In one embodiment, a laser direct write process (LDW) is employed. In LDW, material 24, 26 is added using various laser-induced processes, e.g., laser-induced forward transfer (LIFT), where a sacrificial substrate of solid metal is positioned in close proximity to a second substrate to receive the removed material. The incident laser is absorbed by the material of interest, causing local evaporation. This vapor is propelled toward the substrate, where it re-condenses as solid material (24, 26) to deposit material locally on the existing structure. Variations of LDW permit liquids, inks, and multiphase solutions to be patterned with computer-controlled accuracy. LDW techniques can rely on optical forces to push particles or clusters into precise positions, or rely on chemical changes in liquids and gases to produce patterns.

In one example, an argon laser is employed to deposit aluminum metal from an aluminum methylamine hydride precursor, or other superconductive material, e.g., W, Pb, Nb, etc. using alternative methods. A correction pattern is preferably placed in a position of minimum electric field participation so that reduction of qubit coherence is minimized. The basis for this preference is that high electric fields which are localized near materials or surfaces which may include defects have been shown to be associated with reduced coherence. The high field regions of the capacitor are in the narrowest gaps between the two plates 20 and 22, so adding material further away from this gap can reduce decoherence while still allowing adjustment of the shunt capacitance C.

LDW may include laser-induced chemical vapor deposition (LCVD) and may be applied multiple-level-metal interconnection schemes. In one embodiment, trimethylamine aluminum hydride (TMAAH) may be employed as a source for LCVD for high-purity aluminum films. Aluminum line thickness may be up to several microns using, e.g., constant wavelength (cw) Ar-ion laser pyrolytic CVD.

Figure 3:
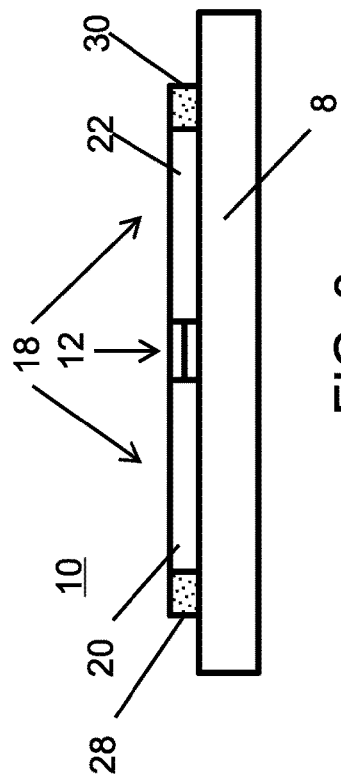
FIG. 3 is a side view of the qubit device of FIG. 1 showing material subtracted or modified on the shunt capacitor using a laser direct write process in accordance with the present principles.

Referring to FIG. 3, in another embodiment, material may be removed to adjust the shunt capacitor 18. Processes may include laser scribing, cutting, drilling, ablation or etching to produce relief structures or holes in materials in ambient or controlled atmospheres. For example, laser ablation may be employed to remove material 28, 30 from the shut capacitor 18. The plates 20, 22 may be adjusted by material removal to alter the shape, thickness, or size of the plates 20, 22.

Laser interactions may also have a direct effect on the quality of the resulting features. For example, a heat affected zone (HAZ) tends to occur around thermally removed material. This region has structures and properties that can differ from the bulk material and can exhibit additional surface relief or adjustment. In such an instance, incident laser energy may not be sufficient to cause ablative effects but is sufficient to cause a permanent change in the material properties. These processes may rely on thermal modifications that cause a structural or chemical change in the material.

It should be understood that FIGS. 1-3 illustratively depict a Josephson junction 12 as the qubit device; however, other devices may be employed. In addition, while the shunt capacitor is the structure being modified, it is understood that adjustments may be made on other structures to adjust the frequency of the qubit device. For example, the capacitor (18) may have a structure that is non-planar. Furthermore, the shunt capacitor 18 may include different shapes and the adjustments may be made to the shape of the capacitor.

Figure 4:
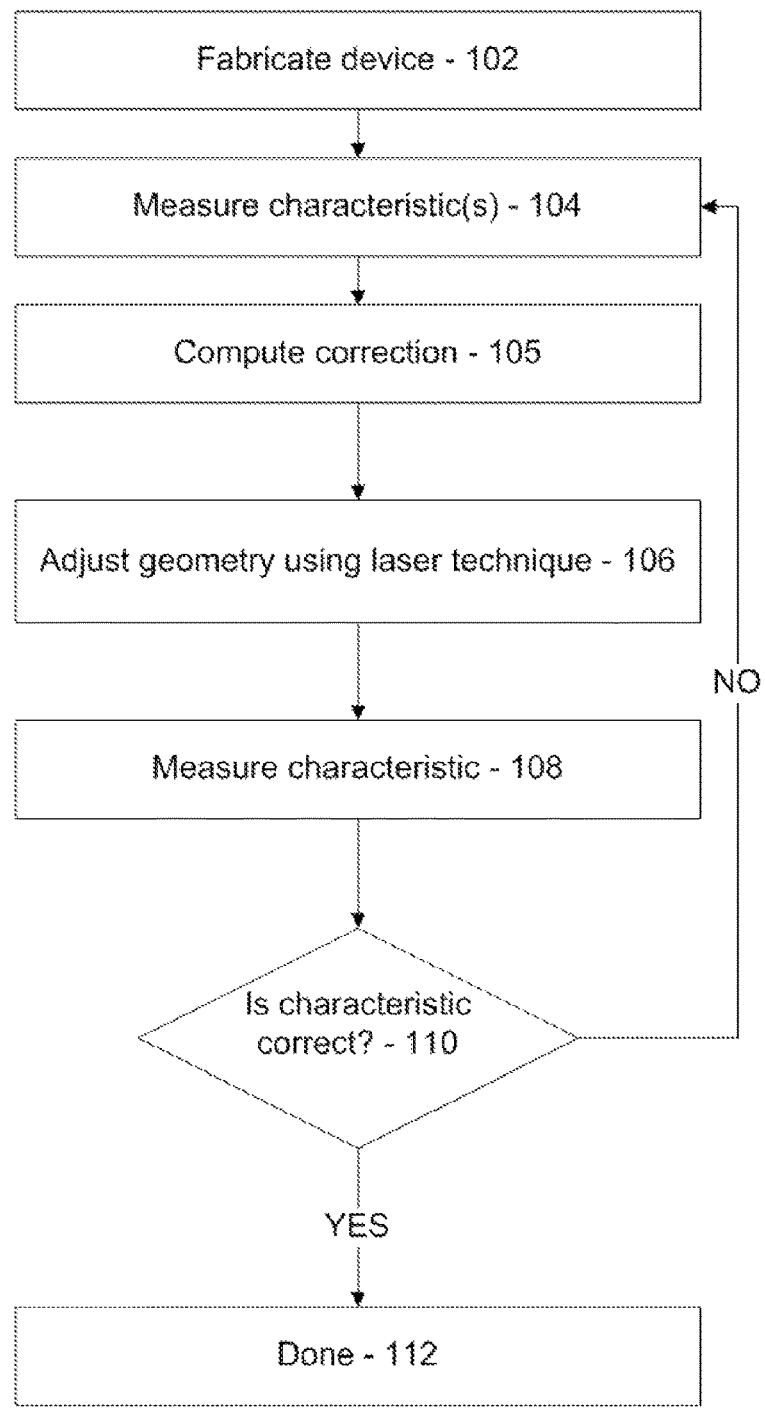
FIG. 4 is a block/flow diagram showing a method for adjusting a qubit frequency in accordance with illustrative embodiments.

Referring to FIG. 4, a block/flow diagram shows a method for adjusting qubits in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a qubit device or a device including qubit devices (e.g., integrated circuit) is fabricated by known processing techniques. After production of the qubit device, the following may be performed. In block 104, the qubit device (or qubit) is measured. This may include measuring a relevant metric/characteristic including qubit frequency, critical current (e.g., at cryogenic temperatures of a few milliKelvin) and/or other properties (e.g., junction resistance (done either at room temperature or cryogenic temperatures)).

In block 105, a correction geometry is computed. Computing a correction includes an accurate calculation of a desired new shape or change, which is needed to achieve the desired frequency, etc., while maintaining other qubit parameters, such as, anharmonicity. The ability to alter the shunt capacitor by modifying the shape to adjust for variations in $I_c$ of the Josephson junction may employ feedback from governing equations that include geometry (shape) and performance criteria. One criterion may include, e.g., adjusting the geometry of the shunt capacitor by forming a correction pattern at a position of minimum electric field participation so that reduction of qubit device coherence is minimized.

In block 106, a shunt capacitor is adjusted by direct laser write methods. This may include adding, modifying or subtracting material from the shunt capacitor. The qubit frequency should be stable against time and temperature cycling. Adjusting the qubit frequency, etc. includes computing a correction (block 105) to determine what modifications are needed, and then shaping or modifying the shunt capacitor in accordance with the computed correction.

In one embodiment, deposition of an aluminum film using laser writing is employed where aluminum is derived from, e.g., trimethylamine aluminum hydride. The deposition may include dimensions in the micron range and thicknesses of between about 0.1 to about 3 microns. Different materials may be deposited using LDW including, e.g., Nb, W, Pb, Al, etc. Superconducting metals are needed to preserve coherence time in the qubit.

In another embodiment, the existing material of the shunt capacitor may be modified, e.g., oxidizing, nitriding, etc., to change its properties using lasers or other techniques. The oxidizing or nitriding may be performed on a portion of the shunt capacitor to tune its properties. In yet another embodiment, material is removed from the shunt capacitor using, e.g., laser-based methods. This may include drilling holes, ablations or otherwise removing materials from a portion of the shunt capacitor.

In block 108, a verification measurement is performed to make sure that the adjustment of the frequency has its intended effect. In block 110, a determination is made as to whether the characteristic is correct. For example, the correct frequency may be equal to (within a pre-specified tolerance) to one of the desired distinct operating frequencies of the qubit. The frequency correction needs to be within an acceptable tolerance of the desired distinct frequency (e.g., less than about 1% difference from a nominal target frequency value). If the frequency is correct, then the process finishes in block 112. Otherwise, the process continues by returning to block 104. The process is repeated as necessary.

Having described preferred embodiments tunable qubits by selective laser-modulated deposition (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for adjusting a qubit, comprising:
    measuring a qubit characteristic of a qubit device;
    computing a modification to correct the qubit characteristic;
    adjusting a geometry of a shunt capacitor using a laser direct write process; and
    verifying that the qubit characteristic has been corrected by the adjusting of the geometry.

2. The method as recited in claim 1, further comprising, repeating the steps until the qubit characteristic has been corrected.

3. The method as recited in claim 1, wherein adjusting the geometry includes adding material to the shunt capacitor.

4. The method as recited in claim 3, wherein adding material to the shunt capacitor includes employing an argon laser with aluminum methylamine hydride to deposit aluminum on the shunt capacitor.

5. The method as recited in claim 1, wherein adjusting the geometry includes removing material from the shunt capacitor.

6. The method as recited in claim 1, wherein adjusting the geometry includes modifying material of the shunt capacitor.

7. The method as recited in claim 6, wherein modifying material of the shunt capacitor includes oxidizing or nitriding the material of the shunt capacitor.

8. The method as recited in claim 1, wherein the qubit device includes a Josephson junction.

9. The method as recited in claim 1, wherein adjusting the geometry includes forming a correction pattern at a position of minimum electric field participation so that reduction of qubit device coherence is minimized.

10. A method for adjusting a qubit, comprising:
fabricating a qubit device, wherein the qubit device includes a Josephson junction;
measuring a qubit characteristic of a qubit device;
computing a modification to correct the qubit characteristic to achieve a needed performance for the qubit device;
adjusting a geometry of a shunt capacitor, post production, using a laser direct write process;
verifying that the qubit characteristic has been changed by the adjusting of the geometry; and
repeating until the qubit characteristic has been corrected.

11. The method as recited in claim 10, wherein adjusting the geometry includes adding material to the shunt capacitor.

12. The method as recited in claim 11, wherein adding material to the shunt capacitor includes employing an argon laser with aluminum methylamine hydride to deposit aluminum on the shunt capacitor.

13. The method as recited in claim 10, wherein adjusting the geometry includes removing material from the shunt capacitor.

14. The method as recited in claim 10, wherein adjusting the geometry includes modifying material of the shunt capacitor.

15. The method as recited in claim 14, wherein modifying material of the shunt capacitor includes oxidizing or nitriding the material of the shunt capacitor.

16. The method as recited in claim 10, wherein adjusting the geometry includes forming a correction pattern at a position of minimum electric field participation so that reduction of qubit device coherence is minimized.

17. A qubit device, comprising:
a Josephson junction; and
a shunt capacitor coupled to the Josephson junction, the shunt capacitor including a shape modified, post-production, to adjust a qubit characteristic for the qubit device.

18. The qubit device as recited in claim 17, wherein the shape modified includes material added to or subtracted from the shunt capacitor using a laser.

19. The qubit device as recited in claim 17, wherein the shape modified includes modified material of the shunt capacitor.

20. The qubit device as recited in claim 17, wherein the shape modified includes a correction pattern at a position of minimum electric field participation so that reduction of qubit device coherence is minimized.

* * * * *